(12) United States Patent
Ko et al.

(10) Patent No.: US 6,691,719 B2
(45) Date of Patent: Feb. 17, 2004

(54) ADJUSTABLE NOZZLE FOR WAFER BEVEL CLEANING

(75) Inventors: Alexander Sou-Kang Ko, Sunnyvale, CA (US); Bernardo Donoso, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 35 days.

(21) Appl. No.: 09/759,390

(22) Filed: Jan. 12, 2001

(65) Prior Publication Data

US 2002/0092917 A1 Jul. 18, 2002

(51) Int. Cl.[7] .................................................. B08B 3/02
(52) U.S. Cl. ....................... 134/148; 134/153; 134/172; 134/181; 134/198; 239/264
(58) Field of Search .............................. 134/94.1, 95.3, 134/99.1, 103.2, 148, 153, 172, 181, 199, 902, 198; 119/321, 323; 239/264, 265, 237, 242, 263.1

(56) References Cited

U.S. PATENT DOCUMENTS

| | | | | |
|---|---|---|---|---|
| 2,419,951 A | * | 5/1947 | Kastel | |
| 2,728,238 A | * | 12/1955 | Paasche | |
| 2,888,903 A | * | 6/1959 | Faber | |
| 3,390,660 A | * | 7/1968 | McDermott | |
| 3,865,525 A | * | 2/1975 | Dunn | |
| 3,904,339 A | * | 9/1975 | Dunn | |
| 4,027,686 A | * | 6/1977 | Shortes et al. | |
| 4,056,075 A | * | 11/1977 | Seiderman | |
| 4,489,740 A | * | 12/1984 | Rattan et al. | |
| 4,564,280 A | * | 1/1986 | Fukuda | |
| 4,614,164 A | * | 9/1986 | Kato et al. | |
| 4,690,325 A | * | 9/1987 | Pacht | |
| 4,857,367 A | * | 8/1989 | Thorn et al. | |
| 5,032,217 A | * | 7/1991 | Tanaka | |
| 5,052,338 A | * | 10/1991 | Maiorca et al. | |
| 5,608,943 A | * | 3/1997 | Konishi et al. | |
| 5,785,068 A | * | 7/1998 | Sasaki et al. | |
| 5,806,138 A | * | 9/1998 | Kawasaki | |
| 5,916,366 A | * | 6/1999 | Ueyama et al. | |

(List continued on next page.)

FOREIGN PATENT DOCUMENTS

| | | | |
|---|---|---|---|
| JP | 62-188323 | * | 3/1987 |
| JP | 2-90523 | * | 3/1990 |
| JP | 1990-90523 | | 3/1990 |
| JP | 3-286530 | * | 12/1991 |
| JP | 4-132209 | * | 5/1992 |
| JP | 1993-175184 | | 7/1993 |
| JP | 5-326481 | * | 12/1993 |
| JP | 6-120136 | * | 4/1994 |

OTHER PUBLICATIONS

European Patent Application 037,261 Sep. 2000.*

*Primary Examiner*—Frankie L. Stinson
(74) *Attorney, Agent, or Firm*—Dugan & Dugan (57) ABSTRACT

A method and an apparatus is provided that may fix a point at which an etchant or a fluid sprayed from a nozzle impacts a substrate. By fixing a first angle measured between the inventive nozzle and a substrate support and fixing a process height of a nozzle relative to a substrate support, a second angle, measured between a fluid sprayed from the nozzle and a line tangent to a substrate support, may vary without affecting the fluid impact point.

20 Claims, 5 Drawing Sheets

U.S. PATENT DOCUMENTS

| | | | |
|---|---|---|---|
| 5,952,050 A | * | 9/1999 | Doan |
| 5,975,098 A | * | 11/1999 | Yoshitani et al. |
| 5,993,547 A | * | 11/1999 | Sato |
| 5,997,653 A | * | 12/1999 | Yamasaka |
| 6,001,219 A | | 12/1999 | Caspar |
| 6,019,843 A | * | 2/2000 | Park et al. |
| 6,033,135 A | * | 3/2000 | An et al. |
| 6,059,893 A | | 5/2000 | Kawasaki |
| 6,106,635 A | * | 8/2000 | Hamada et al. |
| 6,260,562 B1 | * | 7/2001 | Morinishi et al. |
| 6,319,560 B1 | * | 11/2001 | Hawley et al. |
| 6,418,944 B1 | * | 7/2002 | White et al. |
| 6,453,916 B1 | * | 9/2002 | Tran et al. |
| 6,505,636 B1 | * | 1/2003 | Travis |
| 6,543,462 B1 | * | 4/2003 | Lewis et al. |
| 6,589,343 B1 | * | 7/2003 | Egeland |

* cited by examiner

ADJUSTABLE NOZZLE FOR WAFER BEVEL CLEANING

FIELD OF THE INVENTION

The present invention relates generally to an apparatus and a method for cleaning thin discs, such as semiconductor wafers, compact discs, glass substrates and the like. More particularly, the invention relates to cleaning the edges of a thin disc.

BACKGROUND OF THE INVENTION

Semiconductor device manufacturing equipment may employ the use of a nozzle for spraying fluid (e.g., deionized water, SC1, etc.) or an etchant (e.g., nitric acid, etc.) onto a semiconductor substrate on which the semiconductor device is or will be formed. In practice, such semiconductor device manufacturing equipment may require accurate positioning of the nozzle so that the fluid or etchant impacts only a specific portion of the semiconductor substrate. For instance, when a nozzle is employed within an edge bead removal chamber (an EBR chamber), which is adapted to etch the edge of a semiconductor substrate so as to remove a specific material (e.g., copper) formed thereon, the nozzle must be accurately positioned to spray the etchant only onto the edge portion of the semiconductor substrate because the etchant otherwise may undesirably remove material from the major surface of the semiconductor device.

It is difficult, however, to accurately position a nozzle due to the many variables that have to be taken into account. Such variables may include specific angles (e.g., the angle between a nozzle and a line tangent to a semiconductor substrate) and the distance between the nozzle and the semiconductor substrate.

Accordingly, an improved method and apparatus is needed that may calibrate a nozzle's position, may reduce the number of position variables, and may allow for variation of at least one of the position variables.

SUMMARY OF THE INVENTION

An inventive method is provided that (1) prevents variation in (i.e., fixes) a process height of a nozzle relative to a substrate support, (2) fixes an angle of incidence measured between the nozzle and a substrate supported by the substrate support, and (3) allows variation in an impact angle measured between a fluid sprayed from the nozzle and a line tangent to a substrate impacted by the fluid spray. The inventive method may be performed in any conventional apparatus that may require accurate positioning of a nozzle. For example, the inventive method may be employed within an Edge Bead Remover(EBR) chamber.

In addition to the inventive method, an inventive nozzle assembly is also provided. The inventive nozzle assembly comprises a nozzle and a nozzle mounting location configured such that when the nozzle is mounted to the nozzle mounting location, the nozzle's process height and the fluid spray's angle of incidence are fixed, while the fluid spray's impact angle may vary without affecting the point at which the fluid impacts the substrate (i.e., a fluid impact point).

Other features and aspects of the present invention will become more fully apparent from the following detailed description of the preferred embodiments, the appended claims and the accompanying drawings.

DETAILED DESCRIPTION OF THE PREFERRED EMBODIMENTS

An inventive nozzle calibration method is provided that may quickly and accurately position an inventive nozzle. The inventive nozzle calibration method may be performed in any conventional apparatus that may require accurate positioning of a nozzle, such that a point of impact between the substrate and a fluid sprayed from the nozzle (i.e., a fluid impact point) may remain fixed as described further below with reference to FIGS. 1–2B. The inventive nozzle calibration method may be performed in, for example, an edge bead removal chamber (EBR chamber) as described further below with reference to FIGS. 3–4.

Figure 1:
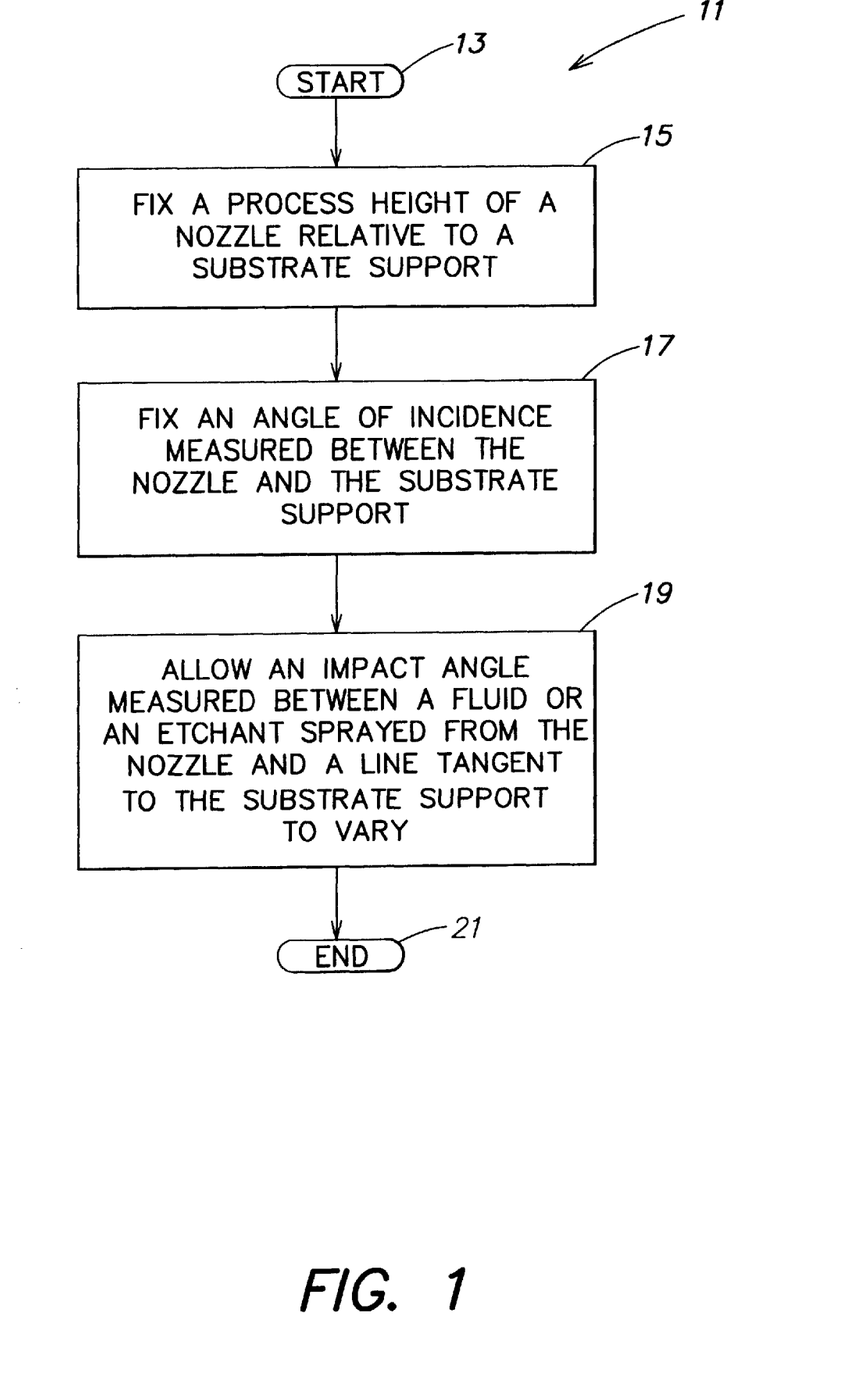
FIG. 1 is a flowchart of the inventive nozzle calibration method that may be performed in any apparatus that may require accurate positioning of a nozzle.
Figure 2A:
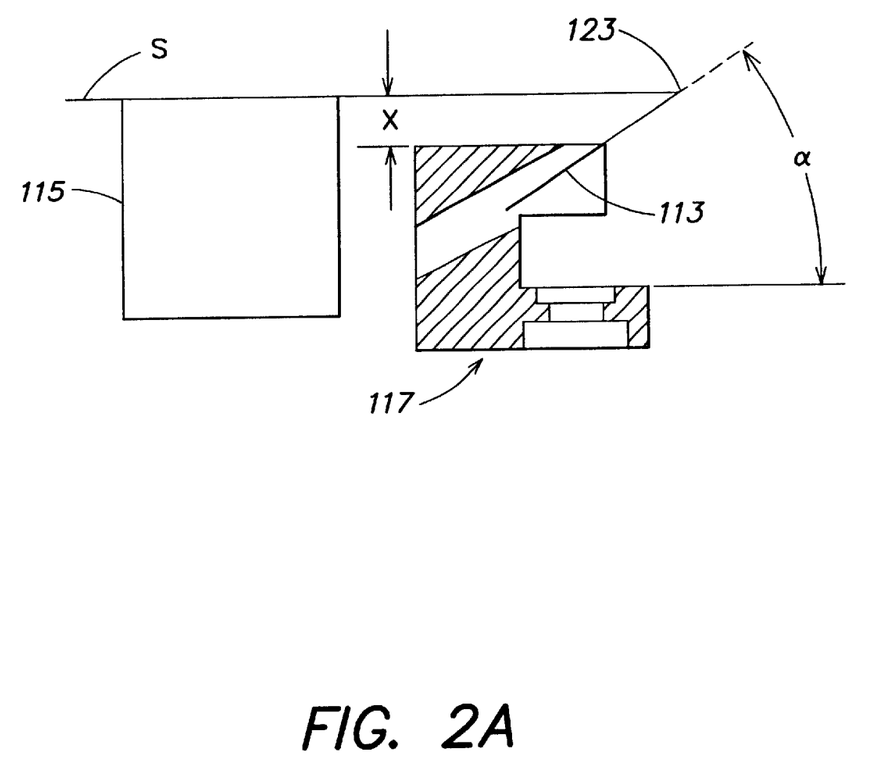
FIGS. 2A and 2B are a schematic side elevational and a schematic top plan view, respectively, of an inventive nozzle positioned relative to a substrate.
Figure 2B:
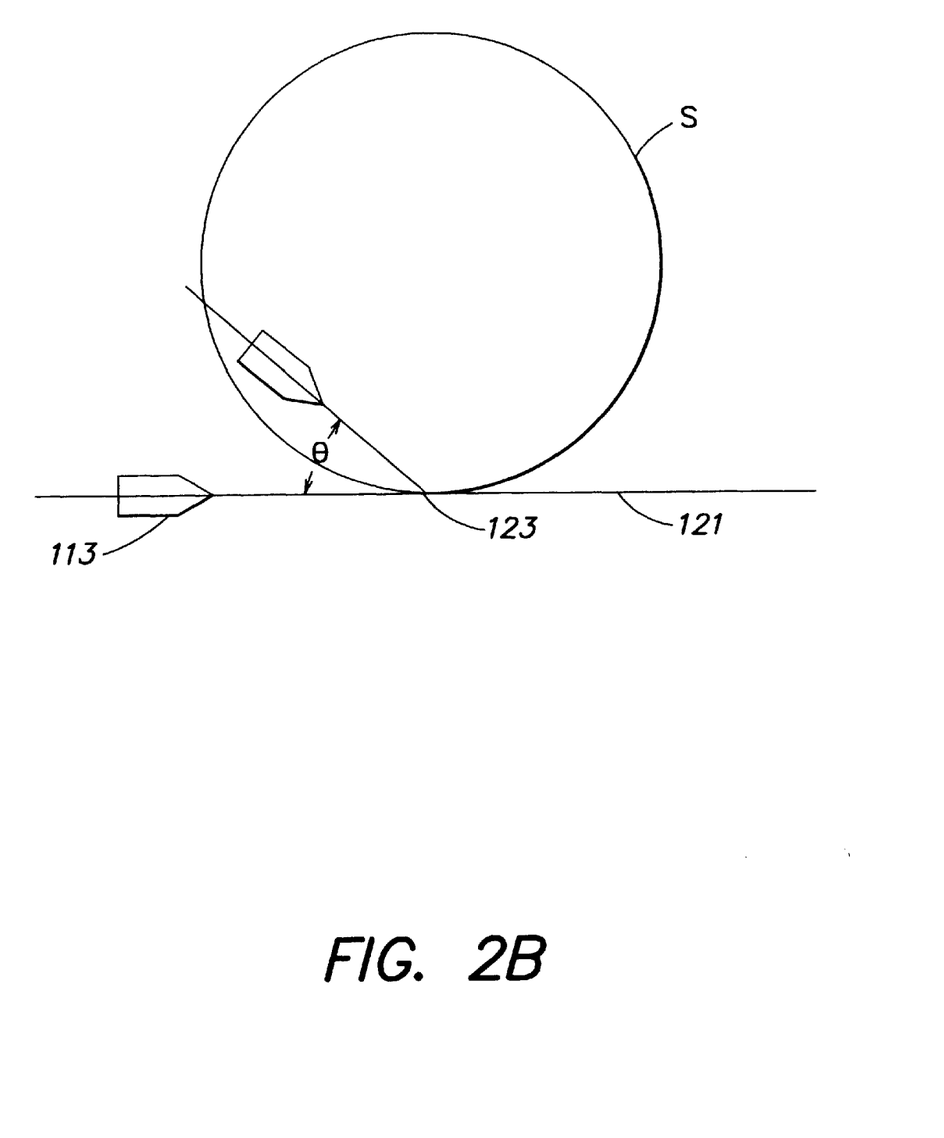

The inventive nozzle calibration method 11 will be described with joint reference to FIGS. 1–2B. FIG. 1 is a flowchart of an inventive nozzle calibration method 11 that may be performed in any apparatus that may require accurate positioning of a nozzle. FIGS. 2A and 2B are a schematic side elevational and a schematic top view, respectively, of an nozzle 113 positioned relative to a substrate S.

With reference to FIG. 1, the inventive nozzle calibration method 11 starts at step 13. In step 15, a process height X measured between the nozzle 113 and a substrate supporting surface of a substrate support 115 is fixed (i.e., can not vary). For example, the nozzle 113 may be positioned such that the process height X is 3.5 mm from the substrate supporting surface of the substrate support 115. The process height X of the nozzle 113 may be fixed by coupling both the nozzle 113 (e.g., via a nozzle mounting arm 117 having the nozzle 113 mounted thereto) and the substrate support 115 to a surface of a chamber (e.g., a bottom wall of a chamber).

Figure 4:
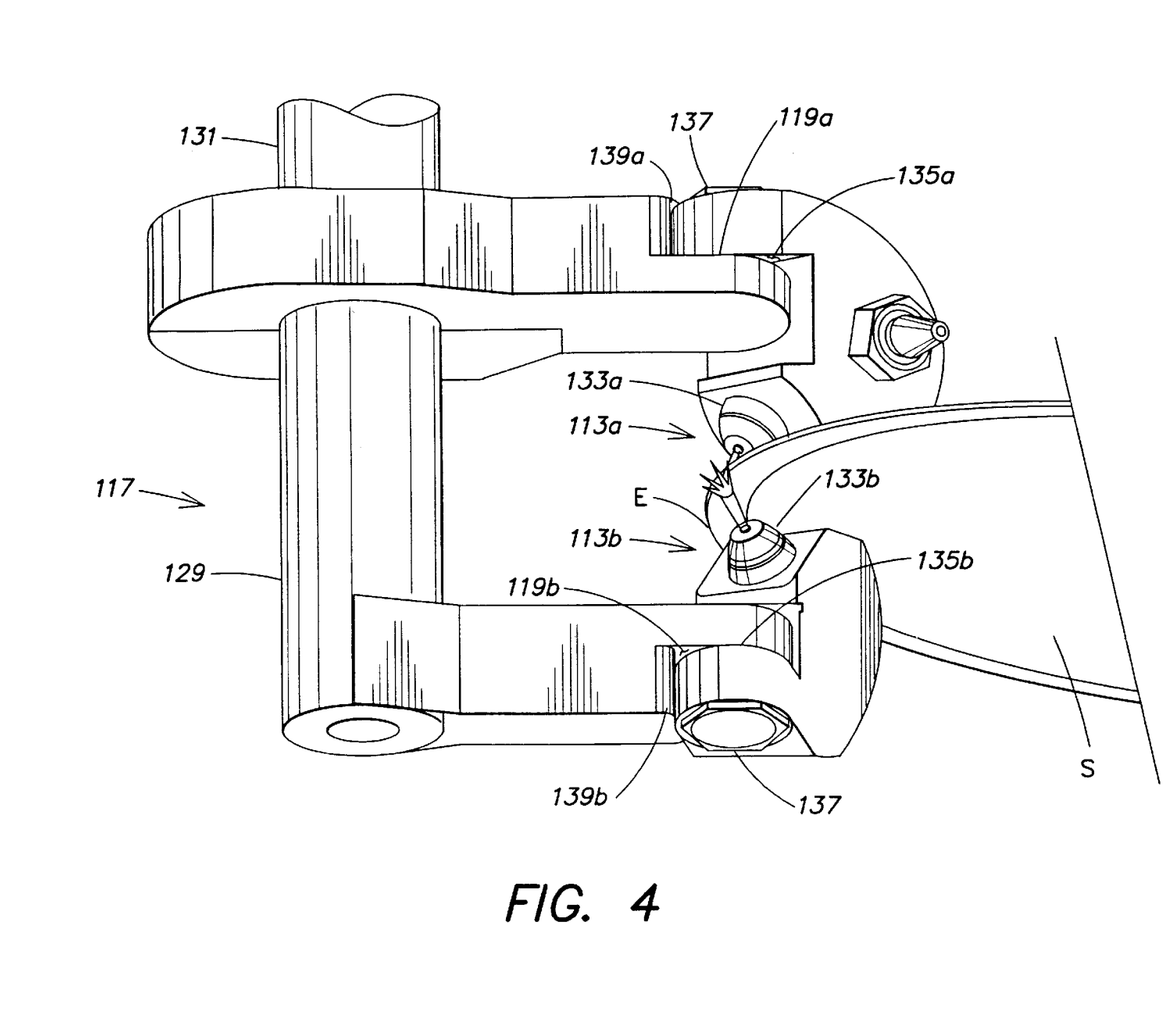
FIG. 4 is a close up side perspective view of the inventive nozzle assembly of FIG. 3.

Then, in step 17, the angle of incidence α measured between the nozzle 113 and a line normal to the substrate's surface is fixed. Thus, the position of the nozzle 113 is fixed in a first plane. For example, the nozzle 13 may be positioned such that the angle of incidence α is 45°. The angle of incidence a, may be fixed by configuring the nozzle 113 and a portion of the nozzle mounting arm 117 to which the nozzle 113 is coupled (i.e., a nozzle mounting location 119 as shown in FIG. 4) such that the nozzle 113 can be properly mounted to the nozzle mounting location 119 only in one orientation.

Thereafter, in step 19, an impact angle θ is allowed to vary as shown in FIG. 2B, the impact angle θ is measured between the fluid sprayed from the nozzle 113 and a line drawn in the plane of the wafer, adjacent the impact point and tangent to the substrate S (tangent line 121). Thus, the nozzle's position is allowed to vary in a second plane, that is, in the plane of the wafer.

In order to illustrate the allowed variation of impact angle θ, FIG. 2B shows the nozzle 113 at two distinct positions relative to the tangent line 121. For example, in a first position A, the impact angle θ is zero. In a second position B, the impact angle θ is 45 degrees. An impact angle θ of 30° is presently preferred.

In one aspect, the impact angle θ may have a limited range within which the impact angle θ may vary, for example to prevent fluid spray from being directed inward toward the center of the substrate S. To limit the range with which the impact angle θ may vary, the nozzle 113 and the nozzle mounting location 119 may be configured such that the nozzle 113 may be mounted to the nozzle mounting location 19 only when the nozzle 113 is within the range with which the impact angle θ permissibly may vary (e.g., the nozzle position is fixedly limited). Such a configuration is further described with reference to FIG. 4. After the variables are thus defined, the process ends at step 21.

Because the angle of incidence α and the process height X are fixed, the impact angle θ measured between the fluid sprayed from the nozzle 113 and the tangent line 121 varies without affecting the fluid impact point 23 as described further below with joint reference to FIGS. 3 and 4, which show the inventive nozzle and nozzle mounting arm 117 mounted with in an EBR chamber 125, and which are useful in describing the inventive nozzle calibration method.

Figure 3:
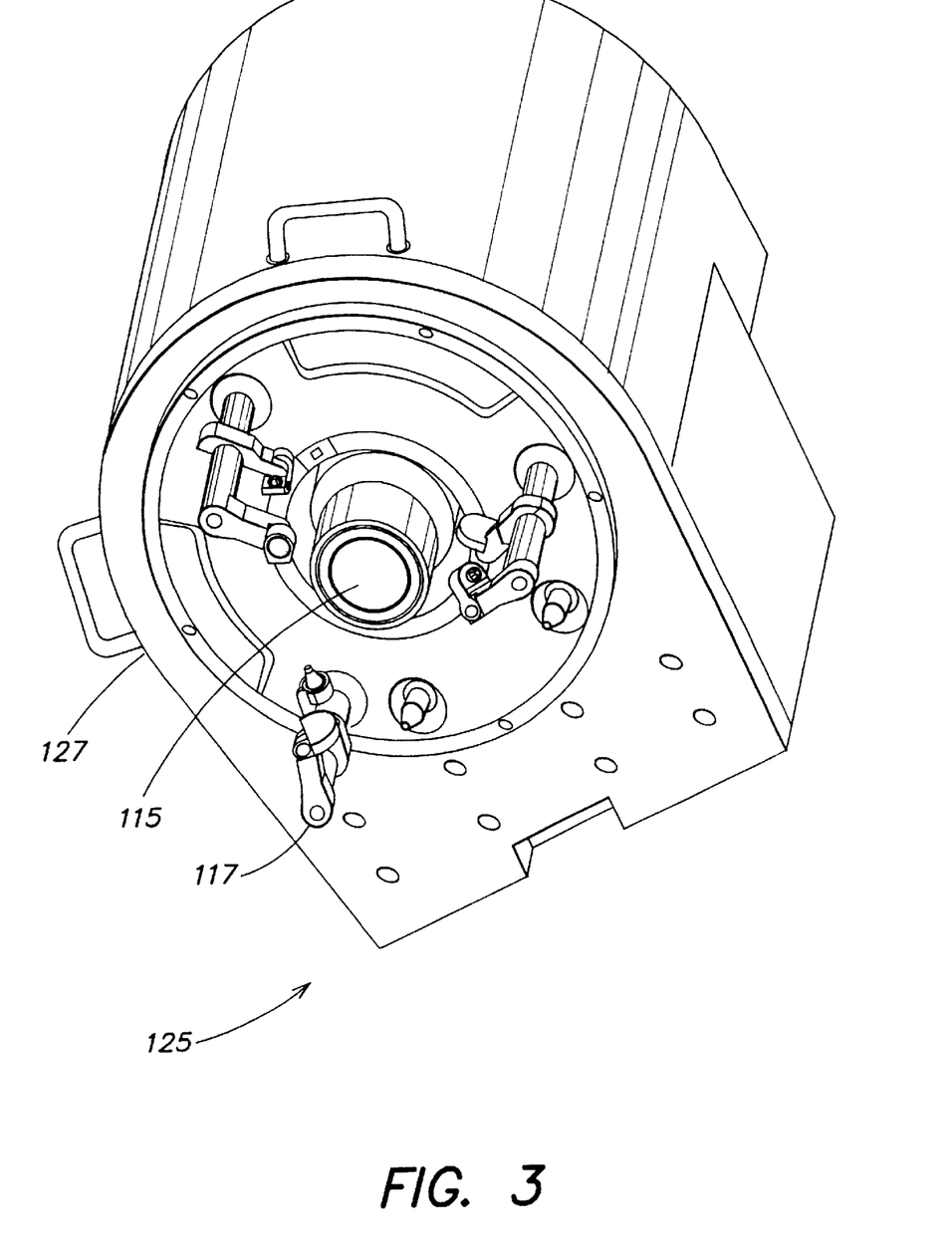
FIG. 3 is a bottom perspective view of the pertinent portions of the EBR chamber that may perform the inventive nozzle calibration method.

FIG. 3 is a bottom perspective view of the pertinent portions of an EBR chamber 125 that are useful in describing the inventive nozzle calibration method 11. The EBR chamber 125 may comprise a lid 127 and a substrate support 115 (e.g., a rotatable platform) mounted thereto and extending downwardly therefrom. The substrate support 115 is adapted to hold a substrate S in a flat position and may employ a vacuum chuck, an electrostatic chuck or other known methods adapted to hold the substrate S in a known position. In this example, the substrate support 115 is further adapted to rotate the substrate S positioned thereon.

The EBR chamber 125 may also comprise one or more of the inventive nozzle assemblies 117, each of which may be mounted to the lid 127. The inventive nozzle assemblies 117 and the substrate support 115 are each coupled to and extend downward from the lid 127 of the EBR chamber 125. Hence, the lid 127 may serve as a datum plane such that a process height X between the substrate S and a portion of the inventive nozzle mounting arm 117 (e.g., an orifice of the nozzle 113 as shown in FIG. 4) may be fixed. Thus, whenever an inventive nozzle 113 is coupled to the nozzle mounting arm 117 and a substrate is positioned on the substrate support, the distance between the nozzle orifice and the substrate support will be a predetermined distance.

FIG. 4 is a close up side elevational view of the inventive nozzle mounting arm 117 of FIG. 3. The nozzle mounting arm may have a plurality of nozzles mounted thereto and adapted to spray an etchant onto the upper edge and lower edges of the substrate S, respectively (such as the pair of nozzles 113a–b shown in FIG. 4). The nozzle 113 may be coupled to the inventive nozzle mounting arm 117 and may be adapted to spray a fluid such as an etchant onto the edge of a substrate S. In one aspect, by adjusting the velocity of the etchant spray, the nozzle 113a–b may direct the etchant spray to a predetermined portion of the substrates S's edge (e.g., to an edge exclusion range E from which material is to be etched), thus controlling the zone of etching. As will be understood from the above description, the inventive nozzle mounting arm 117 may further comprise a nozzle mounting location 119a–b adapted to receive a removably coupled nozzle 113 and a mounting surface 131a–b adapted to mount the nozzle mounting arm 117 within the EBR chamber 125, (e.g., to a surface of the EBR chamber 125, such as the lid 127).

The nozzle mounting location 119a–b, may be configured such that when the nozzle 113 is mounted thereto, the nozzle 113a–b's position is fixed in the first plane, thus fixing the angle of incidence α measured between the nozzle 113a–b and the line normal to the surface of the substrate. The nozzle 113 itself may comprise a spray portion 133a–b and a mounting surface 135a–b adapted to mount to the inventive nozzle mounting arm 117 at the nozzle mounting location 119a–b, e.g., via a bolt 137a–b. In order to fix the angle of incidence α (the nozzle's position in the first plane), the nozzle mounting surface 35 of the nozzle 113 may be configured with a certain angle, and/or with one or more notches or protrusions (not shown) that is/are designed to correspond to an angle and/or one or more protrusions or notches on the nozzle mounting location 119a–b. The nozzle mounting location 119a–b is the nozzle 113a–b's central axis of rotation in a second plane.

In one aspect, the nozzle mounting location 119 may comprise a position limiter 139a–b adapted to define a range in the second plane, within which the nozzle position may vary. In this aspect, the inventive nozzle mounting arm 117 may be configured such that the nozzle 113a–b may only be mounted thereon when the nozzle 113a–b is oriented within the permissible range. Outside the range, the mounting surface 135a–b of the nozzle 113a–b may be blocked by the position limiter 139a–b. Thus, the nozzle 113a–b may be easily mounted within a desired range. Also, the position limiter 139a–b may limit the range within which an impact angle θ (FIG. 2B) (measured between the etchant sprayed from the nozzle 113a–b and a tangent line 121) may vary, such that splashing that may result when the etchant contacts the substrate S, may be directed away from the major surface of the substrate S. Accordingly, when the nozzle position is fixedly limited, the nozzle 113a–b may be mounted to the mounting arm 117, and substrate processing may begin without need for nozzle calibration.

In an exemplary aspect, the inventive nozzle mounting arm 117 may comprise a plurality of the nozzle mounting locations adapted to receive inventive nozzles 113a–b adapted to spray an etchant onto the upper edge and lower edge of the substrate S, respectively as shown in FIG. 4.

In operation, a wafer handler (not shown) places a substrate S on the substrate support 115 and upon actuation (e.g., closing of grippers, electrostatic checking, etc.) of the substrate support 115, the substrate S is held thereon. Thereafter, the substrate support 115 may rotate the substrate S while the inventive nozzles 113a–b supply etchant to the edges of the front and back surfaces of the substrate S, respectively.

As is evident from the description above, the inventive nozzle mounting arm 117 is configured such that the angle of incidence α and the process height X may remain fixed. When the angle of incidence α and the process height X are fixed, the impact angle θ measured between the etchant sprayed from the nozzle 113 and the tangent line 121 may vary without affecting the fluid impact point 123. Thus, the inventive nozzle mounting arm 117 is configured such that the fluid impact point 123 may remain constant regardless of the nozzle 113's position in the second plane. If the nozzle 113 becomes slightly misaligned (relative to the nozzle mounting arm 129) in the second plane or if the nozzle 113 rotates about its central axis of rotation, the fluid impact point 123 may still remain constant.

The foregoing description discloses only the preferred embodiments of the invention, modifications of the above-disclosed apparatus and method which fall within the scope of the invention will be readily apparent to those of ordinary skill in the art. For instance, the number of inventive nozzle assemblies 117 may vary. The inventive aspects may be employed in any conventional apparatus, such as a spinrinse-dryer (SRD). Also, the inventive aspects may be employed regardless of wafer orientation (e.g., horizontal or vertical).

Accordingly, while the present invention has been disclosed in connection with the preferred embodiments thereof, it should be understood that other embodiments may fall within the spirit and scope of the invention, as defined by the following claims.

The invention claimed is:

1. A nozzle assembly comprising:
   a nozzle having a nozzle orifice from which the nozzle is adapted to direct a fluid spray in a first direction, and a nozzle mounting axis about which the nozzle is adapted to be rotated, the nozzle mounting axis being at an angle to the first direction such that a line of sufficient length drawn in the first direction from the nozzle orifice intersects the nozzle mounting axis; and
   a nozzle mounting location adapted such that when the nozzle is mounted thereto the nozzle's position is fixed in a first plane.

2. A nozzle assembly comprising:
   a nozzle having a nozzle orifice from which the nozzle is adapted to direct a fluid spray in a first direction, and a nozzle mounting axis at an angle to the first direction such that a line of sufficient length drawn in the first direction from the nozzle orifice intersects the nozzle mounting axis; and
   a nozzle mounting location adapted such that when the nozzle is mounted thereto the nozzle's position is fixed in a first plane;
   wherein the nozzle mounting location comprises a position limiter adapted to limit the nozzle's position in a second plane.

3. The nozzle assembly of claim 2 wherein the position limiter limits the nozzle's position within a range.

4. A nozzle assembly comprising:
   a nozzle having a nozzle orifice from which the nozzle is adapted to direct a fluid spray in a first direction, and a nozzle mounting axis at an angle to the first direction such that a line of sufficient length drawn in the first direction from the nozzle orifice intersects the nozzle mounting axis;
   an arm having:
     a mounting surface adapted to mount the arm within a processing apparatus; and
     a nozzle mounting location adapted such that when the first nozzle is mounted thereto, the first nozzle's position is fixed in a first plane.

5. The nozzle assembly of claim 4 wherein the nozzle mounting location comprises a position limiter adapted to limit the first nozzle's position in a second plane.

6. The nozzle assembly of claim 5 wherein the position limiter limits the nozzle's position within a range.

7. A nozzle assembly comprising:
   a first nozzle;
   a second nozzle; and
   an arm having:
     a mounting surface adapted to mount the arm within a processing apparatus;
     a first nozzle mounting location adapted such that when the first nozzle is mounted thereto, the first nozzle's position is fixed in a first plane; and
     a second nozzle mounting location adapted such that when the second nozzle is mounted thereto, the second nozzle's position is fixed in the first plane.

8. The nozzle assembly of claim 7 wherein the second nozzle mounting location comprises a position limiter adapted to limit the second nozzle's position in the second plane.

9. The nozzle assembly of claim wherein 8 wherein the position limiter limits the second nozzle's position within a range.

10. The nozzle assembly of claim 9 wherein the first nozzle mounting location and the second nozzle mounting location are adapted such that the first nozzle may output a spray to a top surface of a substrate and such that the second nozzle may output a spray to a bottom surface of the substrate.

11. The nozzle assembly of claim 8 wherein the first nozzle mounting location and the second nozzle mounting location are adapted such that the first nozzle may output a spray to a top surface of a substrate and such that the second nozzle may output a spray to a bottom surface of the substrate.

12. The nozzle assembly of claim 7 wherein the first nozzle mounting location and the second nozzle mounting location are adapted such that the first nozzle may output a spray to a top surface of a substrate and such that the second nozzle may output a spray to a bottom surface of the substrate.

13. A substrate spinner comprising:
   a processing chamber having a first surface;
   a rotatable substrate support coupled to the first surface and adapted to spin a substrate position thereon; and
   a nozzle assembly coupled to the first surface, and comprising:
     a nozzle having a nozzle orifice from which the nozzle is adapted to direct a fluid spray in a first direction, and a nozzle mounting axis at an angle to the first direction such that a line of sufficient length drawn in the first direction from the nozzle orifice intersects the nozzle mounting axis;
     an arm having:
       a mounting surface adapted to mount the arm within a processing apparatus; and
       a nozzle mounting location adapted such that when the nozzle is mounted thereto, the nozzle's position is fixed in a first plane.

14. A nozzle assembly comprising:
   a first nozzle having a first nozzle orifice from which the first nozzle is adapted to direct a fluid spray in a first direction, and a first nozzle mounting axis at an angle to the first direction such that a line of sufficient length drawn in the first direction from the first nozzle orifice intersects the first nozzle mounting axis;
   a second nozzle having a second nozzle orifice from which the second nozzle is adapted to direct a fluid spray in a second direction, and a second nozzle mounting axis at an angle to the second direction such that a line of sufficient length drawn from the second nozzle orifice intersects the second nozzle mounting axis; and
   an arm having:
     a mounting surface adapted to mount the arm within a processing apparatus;
     a first nozzle mounting location adapted such that when the first nozzle is mounted thereto, the first nozzle's position is fixed in a first plane; and
     a second nozzle mounting location adapted such that when the second nozzle is mounted thereto, the second nozzle's position is fixed in the first plane.

15. The nozzle assembly of claim 14 wherein the first nozzle mounting location comprises a position limiter adapted to limit the first nozzle's position in a second plane.

16. The nozzle assembly of claim 15 wherein the position limiter limits the first nozzle's position within a range.

17. The nozzle assembly of claim 16 wherein the first nozzle mounting location and the second nozzle mounting location are adapted such that the first nozzle may output a spray to a top surface of a substrate and such that the second nozzle may output a spray to a bottom surface of the substrate.

18. The nozzle assembly of claim 15 wherein the first nozzle mounting location and the second nozzle mounting location are adapted such that the first nozzle may output a spray to a top surface of a substrate and such that the second nozzle may output a spray to a bottom surface of the substrate.

19. The nozzle assembly of claim 14 wherein the first nozzle mounting location and the second nozzle mounting location are adapted such that the first nozzle may output a spray to a top surface of a substrate and such that the second nozzle may output a spray to a bottom surface of the substrate.

20. A nozzle comprising:

a nozzle orifice from which the nozzle is adapted to direct a fluid spray in a first direction; and a nozzle mounting axis about which the nozzle is adapted to be rotated, the nozzle mounting axis being at an angle to the first direction such that a line of sufficient length drawn in the first direction from the nozzle orifice intersects the nozzle mounting axis.

* * * * *